United States Patent
Majumdar et al.

(10) Patent No.: US 11,113,436 B1
(45) Date of Patent: Sep. 7, 2021

(54) METHOD FOR SIMULATION OF FLOW IN FLUID FLOW NETWORK HAVING ONE-DIMENSIONAL AND MULTI-DIMENSIONAL FLOW COMPONENTS

(71) Applicant: The United States of America as represented by the Administrator of NASA, Washington, DC (US)

(72) Inventors: Alok Kumar Majumdar, Huntsville, AL (US); Paul Alan Schallhorn, Melbourne, FL (US); Andre Christopher LeClair, Huntsville, AL (US)

(73) Assignee: United States of America as Represented by the Administrator of NASA, Washington, DC (US)

( * ) Notice: Subject to any disclaimer, the term of this patent is extended or adjusted under 35 U.S.C. 154(b) by 56 days.

(21) Appl. No.: 16/691,142

(22) Filed: Nov. 21, 2019

(51) Int. Cl.
*G06F 30/20* (2020.01)
*G05D 7/06* (2006.01)

(52) U.S. Cl.
CPC ........... *G06F 30/20* (2020.01); *G05D 7/0676* (2013.01)

(58) Field of Classification Search
CPC .............................. G06F 30/20; G05D 7/0676
See application file for complete search history.

(56) References Cited

U.S. PATENT DOCUMENTS

| | | | | |
|---|---|---|---|---|
| 6,748,349 B1* | 6/2004 | Majumdar | .............. | G06F 30/20 703/9 |
| 7,542,885 B1* | 6/2009 | Majumdar | .............. | G06F 30/23 703/2 |
| 7,890,311 B2* | 2/2011 | Hass | ....................... | G06F 30/20 703/9 |
| 9,122,822 B2* | 9/2015 | Tsunoda | ................... | G06G 7/57 |
| 2009/0287460 A1* | 11/2009 | Hass | ..................... | G06F 30/20 703/2 |
| 2012/0296616 A1* | 11/2012 | Tsunoda | ................... | G06G 7/57 703/9 |
| 2014/0379314 A1* | 12/2014 | Hayashi | ................. | G06F 30/20 703/2 |
| 2016/0377462 A1* | 12/2016 | Ke | .......................... | G06F 30/20 73/861.22 |
| 2019/0332730 A1* | 10/2019 | Ahmad | ................... | G06F 30/20 |

OTHER PUBLICATIONS

Majumdar, Alok. "Numerical Modeling of Conjugate Heat Transfer in Fluid Network." In Thermal Fluid Analysis Workshop, Jet Propulsion Laboratory, Pasadena, CA. 2004. (Year: 2004).*

(Continued)

*Primary Examiner* — Chuen-Meei Gan
(74) *Attorney, Agent, or Firm* — James J. McGroary; Helen M. Galus

(57) ABSTRACT

A computer-implemented method is provided for simultaneous simulation of one-dimensional flow and multi-dimensional flow in a fluid flow network. Processes define meshes of nodes for both one-dimensional and multi-dimensional flow components in a fluid flow network. Another process defines a relational data structure for each adjacent node pair in each multi-dimensional flow component. A flow analysis code is executed to model fluid flow throughout the fluid flow network using the one-dimensional and multi-dimensional meshes of nodes, and each relational data structure.

16 Claims, 3 Drawing Sheets

(56) References Cited

OTHER PUBLICATIONS

Majumdar, Alok. "No Vent Tank Fill and Transfer Line Chilldown Analysis by Generalized Fluid System Simulation Program (GFSSP)." (2013). (Year: 2013).*

Majumdar, Alok K., Andre LeClair, Ric Moore, and Paul A. Schallhorn. "Generalized Fluid System Simulation Program (GFSSP)-Version 6." In 51st AIAA/SAE/ASEE Joint Propulsion Conference, p. 3850. 2015. (Year: 2015).*

Majumdar, Alok, Juan Valenzuela, Andre LeClair, and Jeff Moder. "Numerical modeling of self-pressurization and pressure control by a thermodynamic vent system in a cryogenic tank." cryogenics 74 (2016): 113-122. (Year: 2016).*

Majumdar, Alok. "A Finite Volume Procedure for Thermofluid System Analysis in a Flow Network." In 50 Years of CFD in Engineering Sciences, pp. 231-265. Springer, Singapore, 2020. (Year: 2020).*

Bandyopadhyay, Alak, Alok K. Majumdar, and Kimberly Holt. "Fluid transient analysis during priming of evacuated line." In 53rd AIAA/SAE/ASEE Joint Propulsion Conference, p. 5004. 2017. (Year: 2017).*

LeClair, Andre, and Alok Majumdar. "Computational model of the chilldown and propellant loading of the space shuttle external tank." In 46th AIAA/ASME/SAE/ASEE Joint Propulsion Conference & Exhibit, p. 6561. 2010. (Year: 2010).*

LeClair, Andre, Jason W. Hartwig, Daniel M. Hauser, Mohammad Kassemi, Pablo Diaz-Hyland, and Thomas Going. "Modeling Cryogenic Chilldown of a Transfer Line with GFSSP." In 2018 Joint Propulsion Conference, p. 4756. 2018. (Year: 2019).*

Hedayat, A., Cartagena, W., Majumdar, A.K. and LeClair, A.C., 2016. Modeling and analysis of chill and fill processes for the cryogenic storage and transfer engineering development unit tank. Cryogenics, 74, pp. 106-112. (Year: 2016).*

* cited by examiner

METHOD FOR SIMULATION OF FLOW IN FLUID FLOW NETWORK HAVING ONE-DIMENSIONAL AND MULTI-DIMENSIONAL FLOW COMPONENTS

ORIGIN OF THE INVENTION

The invention described herein was made by employees of the United States Government and may be manufactured and used by or for the Government of the United States of America for governmental purposes without the payment of any royalties thereon or therefor.

BACKGROUND OF THE INVENTION

1. Field of the Invention

This invention relates to flow simulation. More specifically, the invention is computer-implemented method that provides for the simultaneous simulation of one-dimensional flow and multi-dimensional flow in a fluid flow network.

2. Description of the Related Art

Highly accurate fluid dynamic models and computer simulations are critical to the field of fluid dynamics. For example, in liquid rocket propulsion systems, the thermo-fluid dynamics of a propulsion system's propellant tank plays an important role in the safe and reliable operation of a liquid rocket engine. However, a thermo-fluid dynamics analysis of a propellant tank must also take into consideration that the propellant tank is just one part of the propulsion system. Briefly, a propulsion system's propellant tank is connected to a number of supply lines that include components such as pipes, valves, bends, etc., with the entire propulsion system defining a fluid flow network. A propulsion system's supply lines can be simulated accurately using one-dimensional flow equations. However, to simulate the thermo-fluid dynamics characteristics of a propellant tank, multi-dimensional flow equations are required.

Sophisticated fluid dynamics modeling techniques are also relevant for other types of critical fluid networks. For example, researchers use fluid network simulations to design nuclear power and industrial equipment cooling systems, as well as municipal water and mining ventilation systems. Fluid network models with the processing capability to predict fluid behavior in varying dimensions, geometries, and system environments can be readily adapted for other high pressure and low pressure systems. These models can also reflect the unique geometry, fluid temperature, phase and other factors affecting system design.

In general, an accurate fluid network simulation must solve one-dimensional equations and multi-dimensional equations. Both one-dimensional and multi-dimensional equations provide essential data and meet critical testing needs, but the selection of an equation depends on the type of problem to be solved. One-dimensional calculations can be performed quickly such that they require less processing capability. Multi-dimensional equations are more complex such that they require more processing time and capability in order to provide precise analysis of different rates of fluid flow in multi-dimensional planes or three-dimensional volumes.

Engineers and researchers would prefer to receive comprehensive data results that simultaneously solved both one-dimensional equations and multi-dimensional equations in order to provide a complete fluid flow network simulation. However, one-dimensional and multi-dimensional equations are conceptually different such that one-dimensional and multi-dimensional equations must be processed separately by computer components specifically configured to perform either one-dimensional or multi-dimensional algorithms. Subsequently, an additional and specially designed subsystem is used to integrate the separately processed results. Currently, there is no simulation tool that can simultaneously simulate both one-dimensional and multi-dimensional flow using the same model.

SUMMARY OF THE INVENTION

Accordingly, it is an object of the present invention to provide a method for simulating fluid flow in a complex fluid flow network.

Another object of the present invention is to provide a computer-implemented method for simulating flow in a fluid flow network that supports both one-dimensional fluid flows and multi-dimensional fluid flows throughout the network.

Other objects and advantages of the present invention will become more obvious hereinafter in the specification and drawings.

In accordance with the present invention, a computer-implemented method is provided for simultaneous simulation of one-dimensional flow and multi-dimensional flow in a fluid flow network. A first process defines a one-dimensional mesh of nodes in a computer for each first component of a fluid flow network supporting one-dimensional flow there through. A second process defines a multi-dimensional mesh of nodes in the computer for each second component of the fluid flow network supporting multi-dimensional flow there through, wherein a portion of the fluid flow network between any two adjacent nodes of the multi-dimensional mesh of nodes is a flow branch. Sets of two adjacent nodes and corresponding flow branch are defined in the computer. A third process, for each of the sets associated with each second component of the fluid flow network, defines a relational data structure in the computer wherein each relational data structure identifies first flow branches in the multi-dimensional mesh of nodes that lead to and away from a set's two adjacent nodes and that are aligned with the set's corresponding flow branch, second flow branches in the multi-dimensional mesh of nodes that lead to and away from the set's two adjacent nodes and that are not aligned with the set's corresponding flow branch, and third flow branches in the multi-dimensional mesh of nodes immediately adjacent to the set's corresponding flow branch.

A fourth process executes a flow analysis code in the computer to model fluid flow throughout the fluid flow network using the one-dimensional mesh of nodes for each first component, the multi-dimensional mesh of nodes for each second component, and each relational data structure for each second component.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED
EMBODIMENT(S)

The present invention is a tool for use in fluid flow analysis of complex fluid flow networks. More specifically, the present invention presents computer-implemented method for the simultaneous simulation of one-dimensional flow and multi-dimensional flow in a fluid flow network. The results of a simulation implemented in accordance with the present invention will provide an engineer or researcher with critical information as to how a complex fluid flow network will perform since the results are an integration of all fluid flow components in the fluid flow network.

Figure 1:
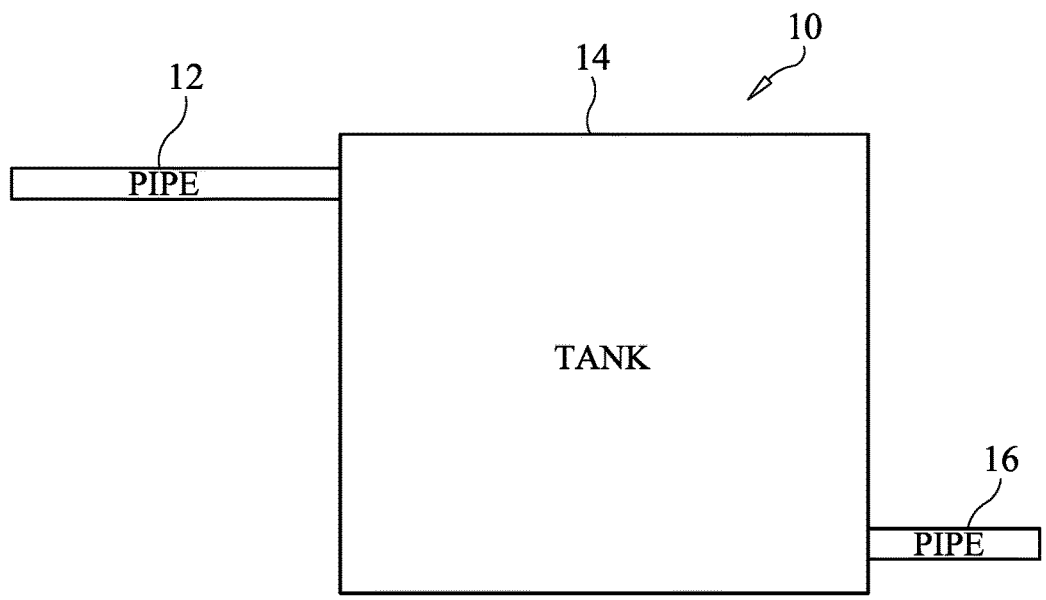
FIG. 1 is a schematic view of a fluid flow network supporting one-dimensional flows and multi-dimensional flows.

In order to provide a description of the present invention, a simple fluid flow network having one-dimensional fluid flow components and a multi-dimensional fluid flow component is illustrated in FIG. 1 and is referenced generally by numeral 10. By way of an illustrative example, fluid flow network 10 includes an inlet pipe 12, a tank 14, and an outlet pipe 16.

Inlet pipe 12 and outlet pipe 16 are representative of one-dimensional flow components, and tank 14 is representative of a multi-dimensional flow component. Fluid flow network 10 supports a fluid inflow 100 through inlet pipe 12 and into tank 14, as well as a fluid outflow 102 from tank 14 and through outlet pipe 16 where outflow 102 is output therefrom. As will be explained further herein, the computer-implemented method of the present invention simultaneously provides simulation data for fluid moving through all of fluid flow network 10. It is to be understood that the present invention can be used with fluid flow networks having additional one and multi-dimensional flow components.

As used herein, the term "one dimensional flow component" (e.g., inlet pipe 12 and outlet pipe 16) is defined as any flow component that can be modeled using one-dimensional flow equations. By way of non-limiting examples, one-dimensional flow components include pipes, ducts, orifices, valves and pumps. The term "multi-dimensional flow component" as used herein refers to any flow component such as tank 14 requiring multi-dimensional flow equations to model same. By way of non-limiting examples, multi-dimensional flow components include tanks, turbo-pumps that encase a rotating impeller, or any fluid-flow-supporting component requiring a detailed flow analysis.

As is known in the art of computational fluid dynamics, one-dimensional flow equations and multi-dimensional flow equations calculate flow characteristics (e.g., pressure, temperature, velocity, flowrate, density, and other thermo-physical properties) at different locations in a flow component. The various locations are known as "nodes" and the flow between two adjacent nodes is referred to as a "flow branch". For one-dimensional flow components, the nodes are located one after another in a serial fashion along the direction of fluid flow movement. For multi-dimensional flow components, the nodes are arranged in multi-dimensions (e.g., two dimensions or three dimensions). Flow in/through a multi-dimensional flow component does not move serially, but rather moves simultaneously in the two or three dimensions of the flow domain. Thus, the flow to a node can be affected by a number of flow branches, and the flow from a node can affect a number of nodes and flow branches. The present invention addresses this issue by defining a relational data structure that will be used by a conventional flow analysis code as will be explained further below.

Figure 2:
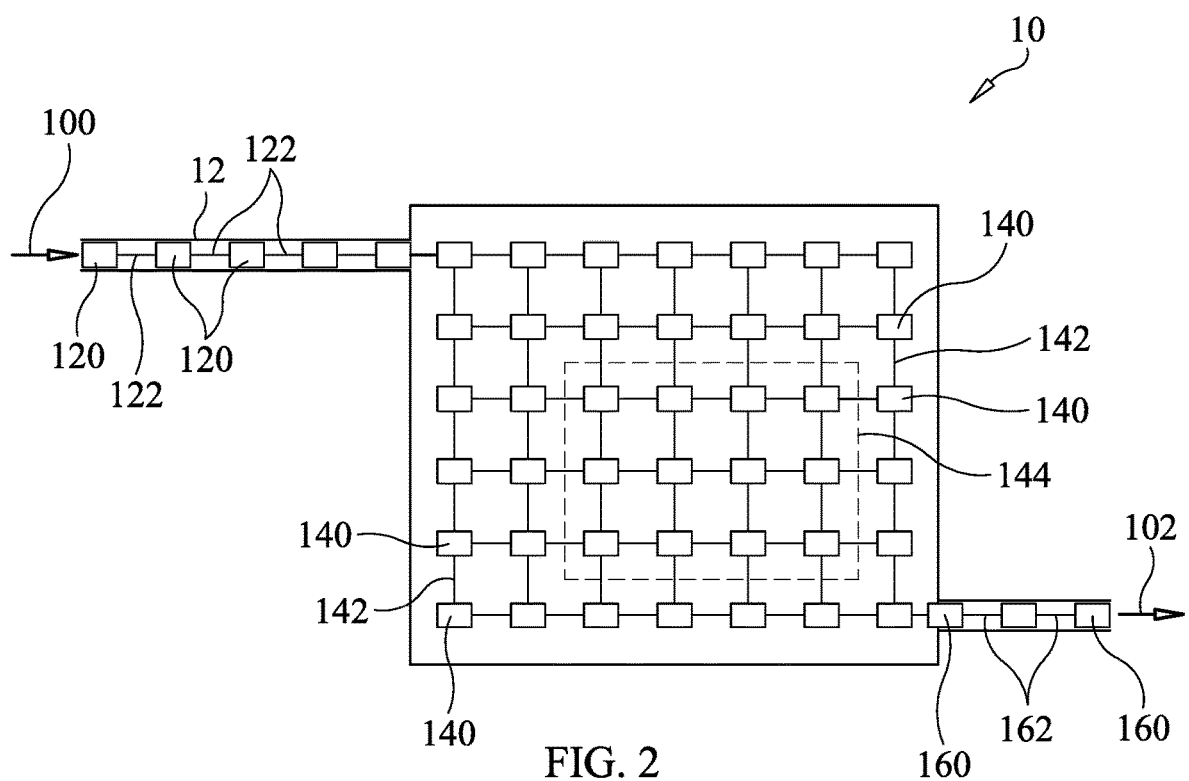
FIG. 2 is a schematic view of the fluid flow network illustrated in FIG. 1 overlaid with meshes of nodes and flow branches used in a computer-implemented method for simultaneous simulation of one-dimensional flow and multi-dimensional flow in the fluid flow network in accordance with an embodiment of the present invention.

Referring now to FIG. 2, fluid flow network 10 is overlaid with meshes of nodes and flow branches used by the present invention's computer-implemented flow simulation method. More specifically, a serial arrangement of nodes 120 are serially connected by flow branches 122 for inlet pipe 12. In a similar fashion, a serial arrangement of nodes 160 are serially connected by flow branches 162 for outlet pipe 16. For tank 14, a multi-dimensional array of nodes 140 is required with flow branches 142 connecting adjacent nodes. For ease of illustration and explanation, nodes 140 and flow branches 142 are arranged in two dimensions. However, it is to be understood that the node and flow branch arrangement is readily extended to three dimensions for any fluid flow component that will experience three-dimensional flow therein.

Figure 3:
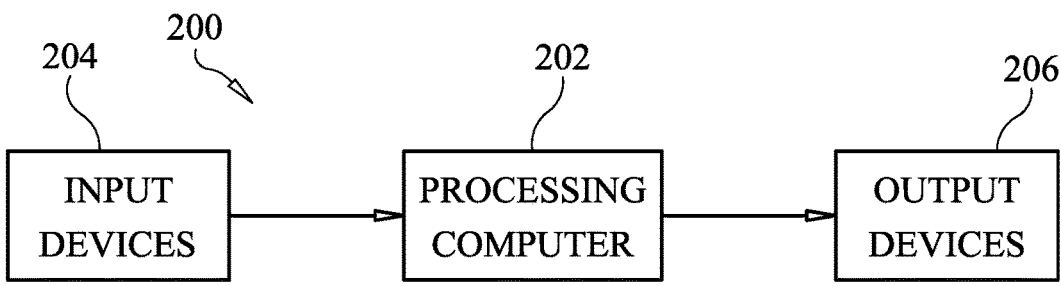
FIG. 3 is a schematic view of system components used to carry out the computer-implemented method in accordance with an embodiment of the present invention.

Prior to describing the present invention, reference is made to FIG. 3 where a computer system for carrying out the method of the present invention is shown and is referenced generally by numeral 200. Computer system 200 includes a processing computer 202, one or more input devices 204 for inputting data to computer 202, and one or more output devices 206 for presentation of simulation results generated by computer 202 in accordance with the present invention. The data supplied to computer 202 via input devices 204 includes node and flow branch data for the fluid flow network (e.g., fluid flow network 10) being simulated.

Figure 4:
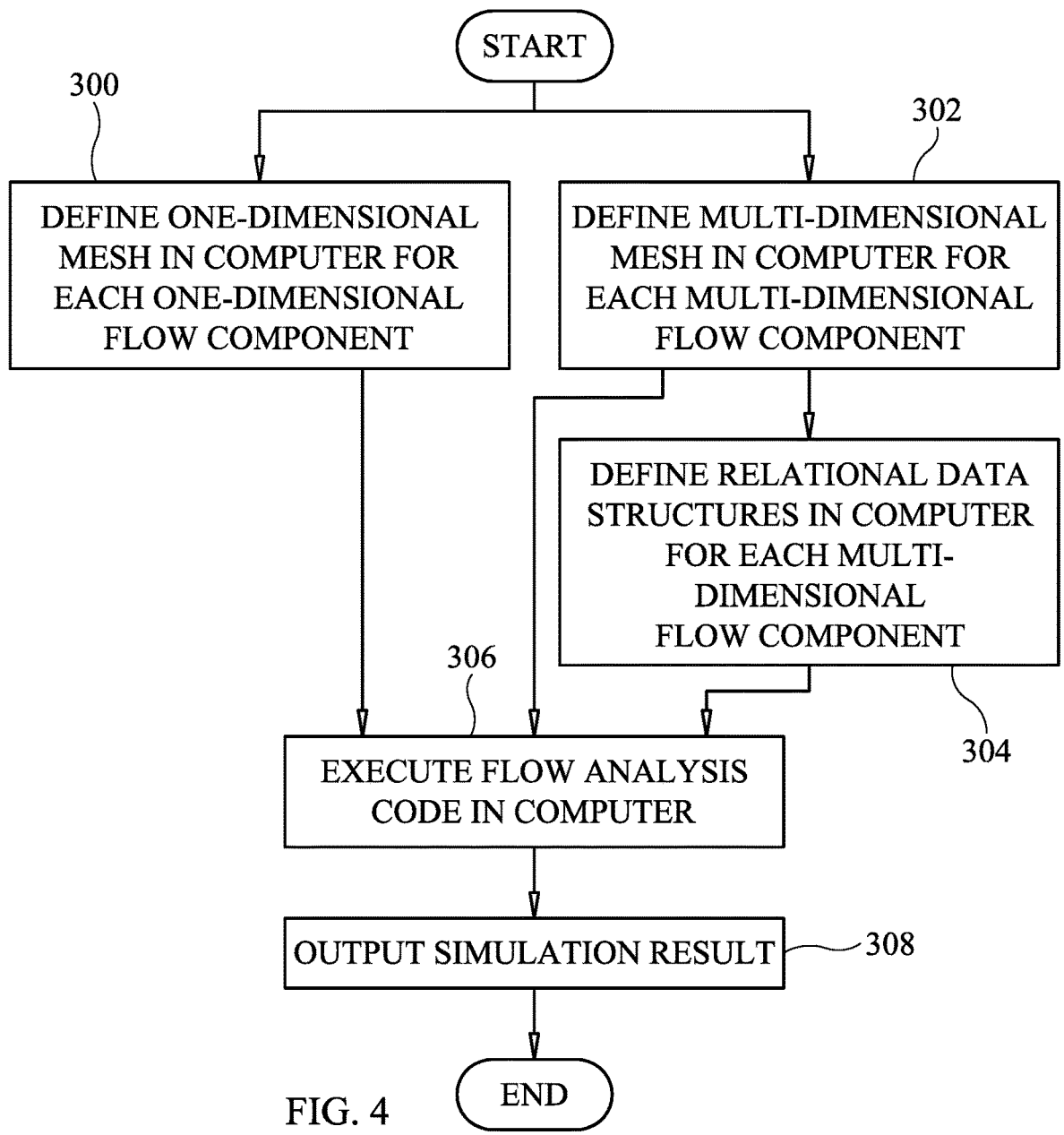
FIG. 4 is a flow diagram of the overall computer-implemented simulation method according to the present invention.

Referring now to FIG. 4, a flow diagram is shown of the computer-implemented method that simultaneously provides for the simulation of one-dimensional flow and multi-dimensional flow in a fluid flow network in accordance with the present invention. A first process 300 defines a one-dimensional mesh of nodes for each of the one-dimensional flow components of a flow network to be simulated. In the illustrated example, process 300 defines the mesh of nodes in computer 202 for inlet pipe 12 and outlet pipe 16. The simple and orderly nature of one-dimensional flows allows them to be modelled by relatively simple one-dimensional flow equations as is well understood in the art.

A second process 302 defines a multi-dimensional mesh of nodes for each of the multi-dimensional flow components of the flow network to be simulated. In the illustrated example, process 302 defines the mesh of nodes in computer 202 for tank 14. Unlike one-dimensional flow components that support a unidirectional flow there through, multi-dimensional flow components generally support fluid flows that are recirculating (i.e., not a unidirectional flow). For example, fluid flows in a tank are subject to swirling motions, sloshing, etc., that can greatly impact a flow analysis or simulation. That is, shear and transverse flow forces must be considered at all points/nodes of a multi-dimensional flow component. Accordingly, the flow characteristics at nodes of a multi-dimensional flow component cannot be modeled by simple equations such that separate processing has always been required for simulations of multi-dimensional flow components.

In order to account for the more complex flows experienced in a multi-dimensional flow component, a third process 304 defines a relational data structure in computer 202 to identify flow branch neighbors that can impact fluid flow between any two adjacent nodes and the corresponding flow branch there between. As will be explained further below, the present invention's novel relational data structure can be integrated into conventional flow analysis code that can then simultaneously simulate flow through an entire fluid flow network.

Figure 5:
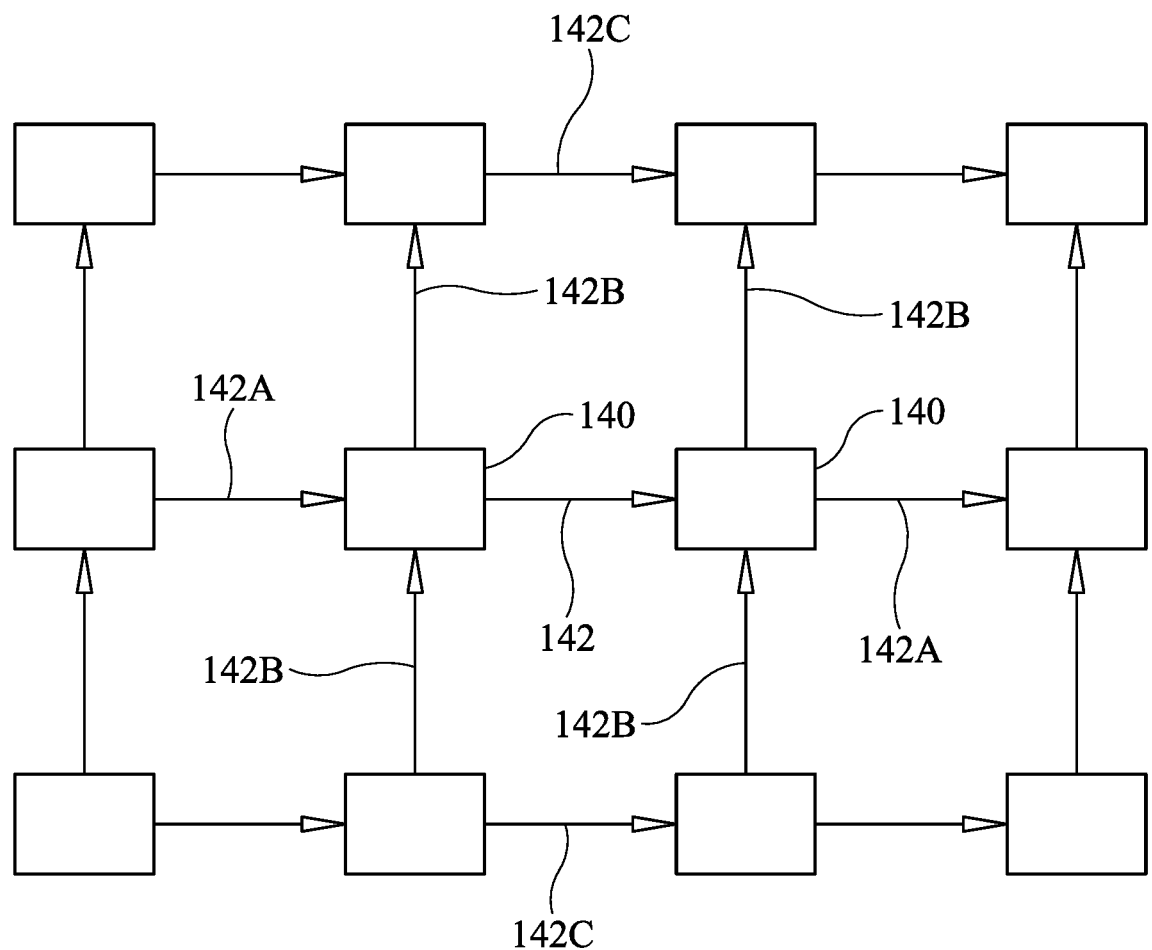
FIG. 5 is an enlarged view of a portion of the mesh of nodes and flow branches from the multi-dimensional flow component illustrated in FIG. 2.

The development of the relational data structure performed by process 304 will be explained with reference to FIG. 5 illustrating an enlarged view of a region (indicated by a dashed-line box 144 in FIG. 2) of nodes 140 and flow branches 142 defined for tank 14. For purpose of the illustration, the relational data structure is developed for the set of adjacent nodes indicated by reference numeral 140 and their corresponding flow branch 142 there between.

The relational data structure developed by process 304 identifies flow branches 142A leading to and away from the set of adjacent nodes 140 where flow branches 142A are aligned with flow branch 142. The relational data structure also identifies flow branches 142B that lead to and away from the set of two adjacent nodes 140 where flow branches 142B are not aligned with flow branch 142. If the fluid flow network is an orthogonal flow network, flow branches 142B will be perpendicular to flow branch 142. If the fluid flow network is a non-orthogonal flow network, flow branches 142B will be at some non-perpendicular angle relative to flow branch 142. Finally, the relational data structure identifies flow branches 142C that are immediately adjacent to flow branch 142. If the fluid flow network is an orthogonal flow network, flow branches 142C will be parallel to flow branch 142. If the fluid flow network is a non-orthogonal flow network, flow branches 142C will have a non-parallel angular relationship with flow branch 142.

Process 304 is performed for the entirety of each multi-dimensional flow component of a fluid flow network to be simulated. Each relational data structure is constructed as an array of data elements (i.e., flow branch identifications) used by a flow analysis code during a simulation. In this way, a flow analysis at any given location in a multi-dimensional flow component has ready access to all surrounding flow branches irrespective of node location and flow movement.

The definitional information generated by processes 300, 302 and 304 are provided to a fourth process 306 that is an execution of a flow analysis code running on, for example, computer 202. Briefly, process 306 is an execution of a conventional flow analysis code provided with all one-dimensional meshes of nodes for the one-dimensional flow components, all multi-dimensional meshes of nodes for the multi-dimensional flow components, and all relational data structures for the multi-dimensional flow components. At the completion of process 306, simulation results can be output at step 308. For example, such results can be provided by computer 202 to one or more output devices 206.

A variety of flow analysis codes can be adapted to employ the method of the present invention. For example, the method described here has been implemented successfully in a NASA-developed flow analysis code known as "GFSSP" (https://www.nasa.gov/gfssp). However, the present invention is not so limited as the method described herein can also be implemented in commercially-available network flow codes such as one available from Thermal Desktop (https://www.crtech.com/products/thermal-desktop), or another available from GT-SUITES (https://www.gtisoft.com/gt-suite/gt-suite-overview/).

The advantages of the present invention are numerous. Complex fluid flow networks having both one-dimensional flow components and multi-dimensional flow components can be simulated in an integrated fashion to thereby mimic the real world. The method presented herein is applicable to a wide variety of complex fluid flow networks to include liquid rocket propulsion systems.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

The invention claimed is:

1. A computer-implemented method for simultaneous simulation of one-dimensional flow and multi-dimensional flow in a fluid flow network, comprising the steps of:
   a first process in which a one-dimensional mesh of nodes is defined in a computer for each first component of the fluid flow network supporting one-dimensional flow there through;
   a second process in which a multi-dimensional mesh of nodes is defined in the computer for each second component of the fluid flow network supporting multi-dimensional flow there through, wherein a portion of the fluid flow network between any two adjacent nodes of the multi-dimensional mesh of nodes is a flow branch, and wherein sets of two adjacent nodes and corresponding flow branch are defined in the computer;
   a third process in which, for each of the sets associated with each second component of the fluid flow network, a relational data structure is defined in the computer wherein each relational data structure is constructed as an array that identifies
   first flow branches in the multi-dimensional mesh of nodes that lead to and away from a set's two adjacent nodes and that are aligned with the set's corresponding flow branch,
   second flow branches in the multi-dimensional mesh of nodes that lead to and away from the set's two adjacent nodes and that are not aligned with the set's corresponding flow branch, and
   third flow branches in the multi-dimensional mesh of nodes immediately adjacent to the set's corresponding flow branch; wherein the array is used in a flow analysis of a multi-dimensional flow component irrespective of node location and flow movement; and
   a fourth process in which a flow analysis code is executed in the computer to model fluid flow throughout the fluid flow network using integration of the one-dimensional mesh of nodes for each first component, the multi-dimensional mesh of nodes for each second component, and each relational data structure for each second component: wherein the first process, the second process and the third process are executed simultaneously in the fourth process.

2. A computer-implemented method according to claim 1, wherein each relational data structure identifies angular relationships between
the set's corresponding flow branch and the second flow branches associated therewith, and
the set's corresponding flow branch and the third flow branches associated therewith.

3. A computer-implemented method according to claim 1, wherein the fluid flow network is an orthogonal flow network,
wherein, for each set of the sets associated with each second component of the fluid flow network, the second flow branches associated with a set are perpendicular to the set's corresponding flow branch, and the third flow branches associated with the set are parallel to the set's corresponding flow branch.

4. A computer-implemented method according to claim 1, wherein each relational data structure comprises the array defined in the computer.

5. A computer-implemented method according to claim 1, wherein each first component is selected from the group consisting of pipes, ducts, orifices, valves, pumps, and flow components modeled by one-dimensional flow equations.

6. A computer-implemented method according to claim 1, wherein each second component is selected from the group consisting of tanks, turbo-pumps, and flow components modeled by multi-dimensional flow equations.

7. A computer-implemented method for simultaneous simulation of one-dimensional flow and multi-dimensional flow in a fluid flow network, comprising the steps of:
a first process in which a one-dimensional mesh of nodes is defined in a computer for each first component of the fluid flow network supporting one-dimensional flow there through;
a second process in which a multi-dimensional mesh of nodes is defined in the computer for each second component of the fluid flow network supporting multi-dimensional flow there through, wherein a portion of the fluid flow network between any two adjacent nodes of the multi-dimensional mesh of nodes is a flow branch, and wherein sets of two adjacent nodes and corresponding flow branch are defined in the computer;
a third process in which, for each of the sets associated with each second component of the fluid flow network, a relational data structure is defined in the computer wherein each relational data structure is constructed as an array that identifies
first flow branches in the multi-dimensional mesh of nodes that lead to and away from a set's two adjacent nodes and that are aligned with the set's corresponding flow branch,
second flow branches in the multi-dimensional mesh of nodes that lead to and away from the set's two adjacent nodes and that are not aligned with the set's corresponding flow branch, and
third flow branches in the multi-dimensional mesh of nodes immediately adjacent to the set's corresponding flow branch; wherein each relational data structure identifies angular relationships between the set's corresponding flow branch and the second flow branches associated therewith, and wherein each relational data structure identifies angular relationships between the set's corresponding flow branch and the third flow branches associated therewith; wherein the array is used in a flow analysis of a multi-dimensional flow component irrespective of node location and flow movement; and
a fourth process in which a flow analysis code is executed in the computer to model fluid flow throughout the fluid flow network using integration of the one-dimensional mesh of nodes for each first component, the multi-dimensional mesh of nodes for each second component, and each relational data structure for each second component: wherein the first process, the second process and the third process are executed simultaneously in the fourth process.

8. A computer-implemented method according to claim 7, wherein the fluid flow network is an orthogonal flow network.

9. A computer-implemented method according to claim 7, wherein each first component is selected from the group consisting of pipes, ducts, orifices, valves, pumps, and flow components modeled by one-dimensional flow equations.

10. A computer-implemented method according to claim 7, wherein each second component is selected from the group consisting of tanks, turbo-pumps, and flow components modeled by multi-dimensional flow equations.

11. A computer-implemented method for simultaneous simulation of one-dimensional flow and multi-dimensional flow in a fluid flow network, comprising the steps of:
providing a processing computer;
defining a one-dimensional mesh of nodes in the processing computer for each first component of the fluid flow network supporting one-dimensional flow there through;
defining a multi-dimensional mesh of nodes in the processing computer for each second component of the fluid flow network supporting multi-dimensional flow there through, wherein a portion of the fluid flow network between any two adjacent nodes of the multi-dimensional mesh of nodes is a flow branch, and wherein sets of two adjacent nodes and corresponding flow branch are defined in the processing computer;
defining, for each of the sets associated with each second component of the fluid flow network, a relational data structure in the processing computer wherein each relational data structure is constructed as an array that identifies first flow branches in the multi-dimensional mesh of nodes that lead to and away from a set's two adjacent nodes and that are aligned with the set's corresponding flow branch,
second flow branches in the multi-dimensional mesh of nodes that lead to and away from the set's two adjacent nodes and that are not aligned with the set's corresponding flow branch, and
third flow branches in the multi-dimensional mesh of nodes immediately adjacent to the set's corresponding flow branch; wherein the array is used in a flow analysis of a multi-dimensional flow component irrespective of node location and flow movement; and
executing a flow analysis code in the processing computer to model fluid flow throughout the fluid flow network using integration of the one-dimensional mesh of nodes for each first component, the multi-dimensional mesh of nodes for each second component, and each relational data structure for each second component; wherein the first process, the second process and the third process are executed simultaneously in the fourth process.

12. A computer-implemented method according to claim 11, wherein each relational data structure identifies angular relationships between the set's corresponding flow branch and the second flow branches associated therewith, and the set's corresponding flow branch and the third flow branches associated therewith.

13. A computer-implemented method according to claim 11, wherein the fluid flow network is an orthogonal flow network, wherein, for each set of the sets associated with each second component of the fluid flow network, the second flow branches associated with a set are perpendicular to the set's corresponding flow branch, and the third flow branches associated with the set are parallel to the set's corresponding flow branch.

14. A computer-implemented method according to claim 11, wherein each relational data structure comprises the array defined in the processing computer.

15. A computer-implemented method according to claim 11, wherein each first component is selected from the group consisting of pipes, ducts, orifices, valves, pumps, and flow components modeled by one-dimensional flow equations.

16. A computer-implemented method according to claim 11, wherein each second component is selected from the group consisting of tanks, turbo-pumps, and flow components modeled by multi-dimensional flow equations.

\* \* \* \* \*